United States Patent [19]

Lee et al.

[11] Patent Number: 5,942,838
[45] Date of Patent: Aug. 24, 1999

[54] ROTARY MOTOR DRIVEN BY A PIEZOELECTRIC COMPOSITE LAMINATE

[75] Inventors: Shi Wei Ricky Lee, Kowloon; Hing Leung Li, Yuen Long, both of The Hong Kong Special Administrative Region of the People's Republic of China

[73] Assignee: The Hong Kong University of Science & Technology, The Hong Kong Special Administrative Region of the People's Republic of China

[21] Appl. No.: 08/914,191
[22] Filed: Aug. 19, 1997
[51] Int. Cl.⁶ .................................................. H01L 41/04
[52] U.S. Cl. .................................. 310/333; 310/323
[58] Field of Search ............................ 310/330, 332, 310/323

[56] References Cited

U.S. PATENT DOCUMENTS

| | | | |
|---|---|---|---|
| 4,349,762 | 9/1982 | Kitamura et al. | 310/332 |
| 4,363,993 | 12/1982 | Nishigaki et al. | 310/332 |
| 4,468,583 | 8/1984 | Mori | 310/332 |
| 5,581,143 | 12/1996 | Miura et al. | 310/332 |

Primary Examiner—Clayton LaBalle
Assistant Examiner—Peter Medley
Attorney, Agent, or Firm—Burns, Doane, Swecker & Mathis, L.L.P.

[57] ABSTRACT

There is described a rotary motor in which a rotor disc is driven by a plate-like driving member comprising a laminate of piezoelectric material sandwiched between outer layers of anisotropic material. When a voltage is applied to the rotor disc the driving member expands into driving contact with the rotor disc and—at the same time—owing to the anisotropy of the outer layers, twists with a torsional movement and this torsional movement imparts a rotary movement to the rotor disc.

10 Claims, 3 Drawing Sheets

ROTARY MOTOR DRIVEN BY A PIEZOELECTRIC COMPOSITE LAMINATE

FIELD OF THE INVENTION

This invention relates to a rotary motor, and in particular to a novel design of rotary motor driven by a piezoelectric composite laminate material.

BACKGROUND OF THE INVENTION

In recent years a considerable amount of research has been done on ultrasonic motors that use mechanical vibrations in the ultrasonic range as the drive source. The mechanical vibrations are created by piezoelectric elements that are caused to alternately expand and contract by the application of an alternating electric field. The magnitude of these vibrations is usually very small, but by applying resonance principles large gain can be obtained. The direction of the vibrations are normally mechanically rectified so as to obtain the required motor output.

In principle such motors have a number of advantages over conventional electromagnetic motors. For example, they are capable of operating at low speed and with a very high output torque. Another important advantage of piezoelectric motors is that unlike electromagnetic motors they are not sensitive to any ambient electromagnetic fields, thus they may be used in applications where conventional motors cannot be used without difficulty.

PRIOR ART

FIG. 1 illustrates an example of a conventional piezoelectric motor known as a travelling wave ultrasonic motor. In this motor a ring is provided, of which only a segment is shown in FIG. 1. At selected locations about the circumference of the ring there are provided two ceramic piezoelectric elements A and B that are caused to vibrate at $C \sin \omega t$ and $C \cos \omega t$ respectively by an applied voltage. The piezoelectric elements are fixed to one side of a metal stator and their vibrations set up a travelling wave in the stator which cause rotation of a slider or rotor mounted on top of the stator. The speed of rotation is dependent on the amplitude C of the vibrations, while the direction of rotation can be changed easily by changing the polarity of the voltage applied to the piezoelectric elements.

Although existing piezoelectric motors have found a number of practical applications, a disadvantage of them in comparison with conventional electromagnetic motors, is their relative complexity and therefore cost which is an impediment to their further applications.

SUMMARY OF THE INVENTION

According to the present invention there is provided a motor comprising, a plate-like laminate driving member comprising an inner layer of piezoelectric material and outer layers formed of an anisotropic material, said driving member being fixed at a first end, a rotor disc positioned closely adjacent a second end of said driving member such that said driving member is generally perpendicular to said disc, and means for applying an electric voltage to said piezoelectric material, wherein when no voltage is applied to said piezoelectric material said driving member is in loose contact with said disc, and wherein upon application of a voltage to said piezoelectric material said driving member expands into firm contact with said disc with a torsional movement and imparts a rotary motion to said disc.

The inner layer of the driving member may be formed of any suitable piezoelectric material, but a particularly preferred material is a piezoelectric ceramic material such as lead-zincronate-titanate. Equally the outer layers of the driving member may be formed of any anisotropic material, and a preferred example of such a material would be a fiber-reinforced plastics material, eg a graphite fiber reinforced epoxy resin.

The dimensions of the driving member are flexible, but the thickness of the member should be significantly less than its length and width. Although not essential, particularly good performance can be obtained if the width of the driving member is equal to the diameter of the rotor disc.

The voltage may be applied to the piezoelectric element through a high voltage power supply which in turn may be computer-controlled. By controlling the application of voltage to the piezoelectric material the manner in which the motor is operated may be controlled, eg in a continuous mode or as a stepper motor.

In another embodiment of the invention the motor may be provided with a plurality of driving members, for example two mutually orthogonal driving members, to which power is successively applied so that they each drive the rotor disc in turn.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENT

Figure 1:
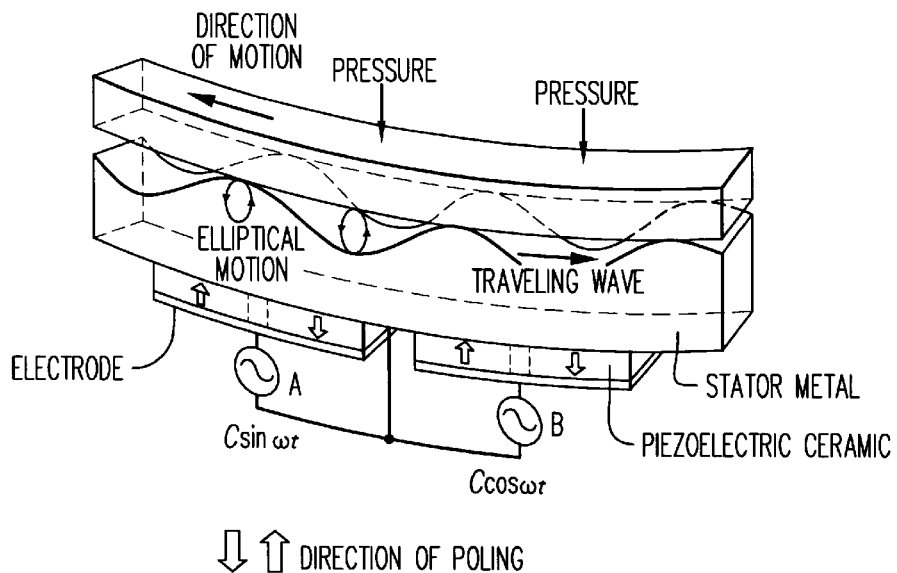
FIG. 1 is a perspective view of a conventional piezoelectric travelling wave motor, FIG. 2 schematically illustrates an embodiment of the present invention.
Figure 2:
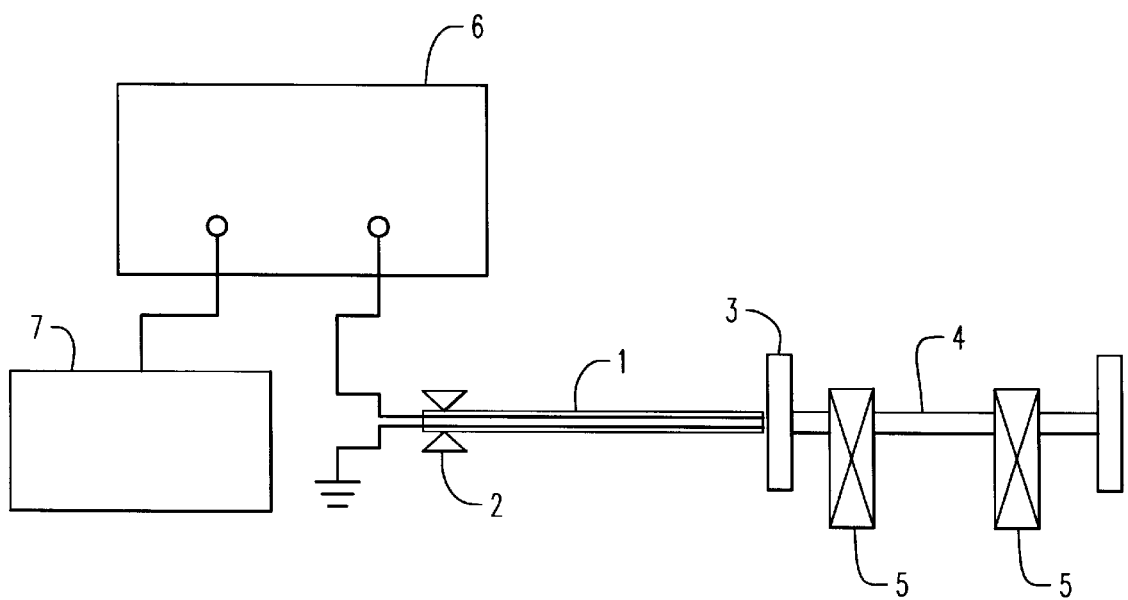
Figure 3A:
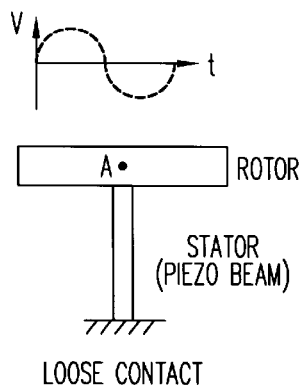
FIGS. 3(a)–(e) illustrate the actuation principles of the present invention.
Figure 3B:
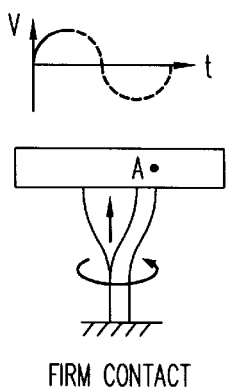
Figure 3C:
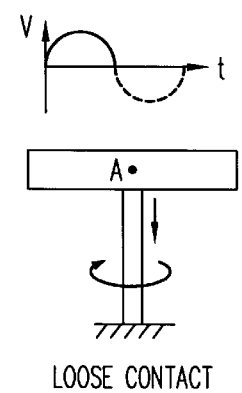
Figure 3D:
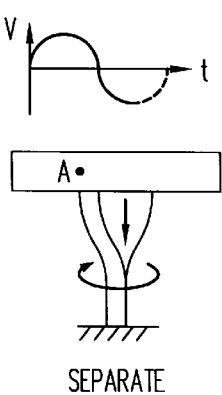
Figure 3E:
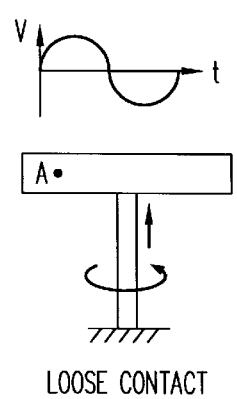

In a preferred form of the present invention, as illustrated in FIG. 2, the motor is actuated by a driving member in the form of a piezoelectric beam 1. The beam 1 comprises a piezoelectric laminate three-layer composite material, comprising a layer of piezoelectric ceramic material sandwiched between two anti-symmetric composite laminae. It is important that the laminae are anisotropic, and a convenient way of 20 achieving this is for them to be formed of an epoxy material reinforced by graphite fibres. The required anisotropy can be obtained by arranging the laminae so that the fibres in the two outer layers of the piezoelectric beam run in θ and −θ directions.

In the embodiment shown in FIG. 2 the two anti-symmetric laminae are made from unidirectional Hercules AS4/3501-6 graphite/epoxy composites with the fibre directions oriented at 45° and −45° respectively. The middle layer of piezoelectric material is comprised of any piezoelectric material that is able to provide a sufficient actuation force. Particularly suitable materials for this middle layer are piezoelectric ceramic materials such as lead-zincronate-titanate (PZT).

Other possible materials for the anisotropic outer laminae include any kind of anisotropic materials. Possibilities include natural anisotropic materials such as bamboo, but the most commonly used anisotropic materials are fiber reinforced plastics. Because the elastic modulus of the fiber is usually much higher than that of the matrix material, the stiffness of the composite in the fiber reinforced direction is larger than that in the other direction and thus provides the anisotropy. Carbon fiber reinforced epoxy resin is preferred, but glass or steel fibers could also be employed.

The beam 1 is a generally plate-like structure. The beam may be elongate, that is to say the length of the beam (ie its dimension along the axis of rotation of the motor) is significantly greater than its width, or the length may be smaller than the width. In either case the thickness is significantly less than the other two dimensions (about five times). In a typical embodiment the dimensions may be: length 90 mm, width 25 mm, thickness 3 mm, but a beam with dimensions of: length 10 mm, width 25 mm, thickness 3 mm was also found to work. To maximise the torque output the width of the beam is preferably equal to the diameter of the rotor.

Turning to FIG. 2 in particular an elongate beam 1 (90 mm×25 mm×3 mm) is fixed at one end by a rigid support 2 with a clamping area of 25 mm×25 mm. The distal end of the beam 1 is free and is located in loose contact with a rotor disc 3. Rotor disc 3 is fixed to one end of a shaft 4 which is rotatably mounted in bearings 5. The beam comprises an inner layer of a piezoelectric ceramic material in the form of PZT-5H obtained from Morgan Matroc, with outer laminae of unidirectional Hercules AS4/3501-6 graphite/epoxy composites with the fiber directions oriented at 45° and −45° respectively. The thickness of each layer of the beam 1 was 1 mm.

Two lead were soldered to the top and bottom electrode surfaces of the piezoelectric PZT layer at the end of the fixed end of beam 1 and connected to a high-voltage power supply 6. The power supply 6 is in turn controlled by a function generator 7 at 1300 Hz and the amplitude of the power supply is set at 150 V.

Upon the application of an electric field to the PZT inner layer a strain is induced in the inner layer and because this inner layer is sandwiched by outer anisotropic layers this in-plane strain is translated into a torsional motion while at the same time the beam expands into firm contact with the rotor disc 2. The expansion of the beam so that it contacts the disc 2 forms a clutch mechanism, and the torsional motion of the beam is then transmitted to the rotor disc 2. When the applied electric field is removed, the beam 1 contracts so that it does not contact the rotor disc 2 while the beam untwists itself back into a plane condition. This twisting-extension coupling is shown in FIGS. 3(a)–(e). It will be appreciated that because the extension of the beam brings it into and out of contact with the rotor disc the torsional motion is only applied to the rotor disc when the beam is in contact with the disc. Thus when the beam expands into contact a torsion motion in one rotary direction is applied to the disc. When the voltage is removed from the piezoelectric element there is a reverse torsional movement as the beam relaxes, but this is not transferred to the rotor disc since the beam will at that point not be in contact with the disc.

The effect is that as a voltage is applied to the beam at high frequency the beam repeatedly undergoes this cycle and in each cycle a small rotary motion is imparted to the disc and continuous rotary motion of the disc is possible by applying a high frequency electric field to the piezoelectric beam. The speed of rotation of the rotor disc will depend on the magnitude of the applied voltage (which will affect the size of each individual rotary "push" given by the beam).

Performance of the motor is best if this frequency of the applied electric field is chosen to match a resonance frequency of the beam. The resonance frequency will depend on the dimensions and material chosen for the beam, but an approximate value can be readily calculated, and then fine-tuned by sweeping through a range of frequencies around the calculated value.

Figure 4:
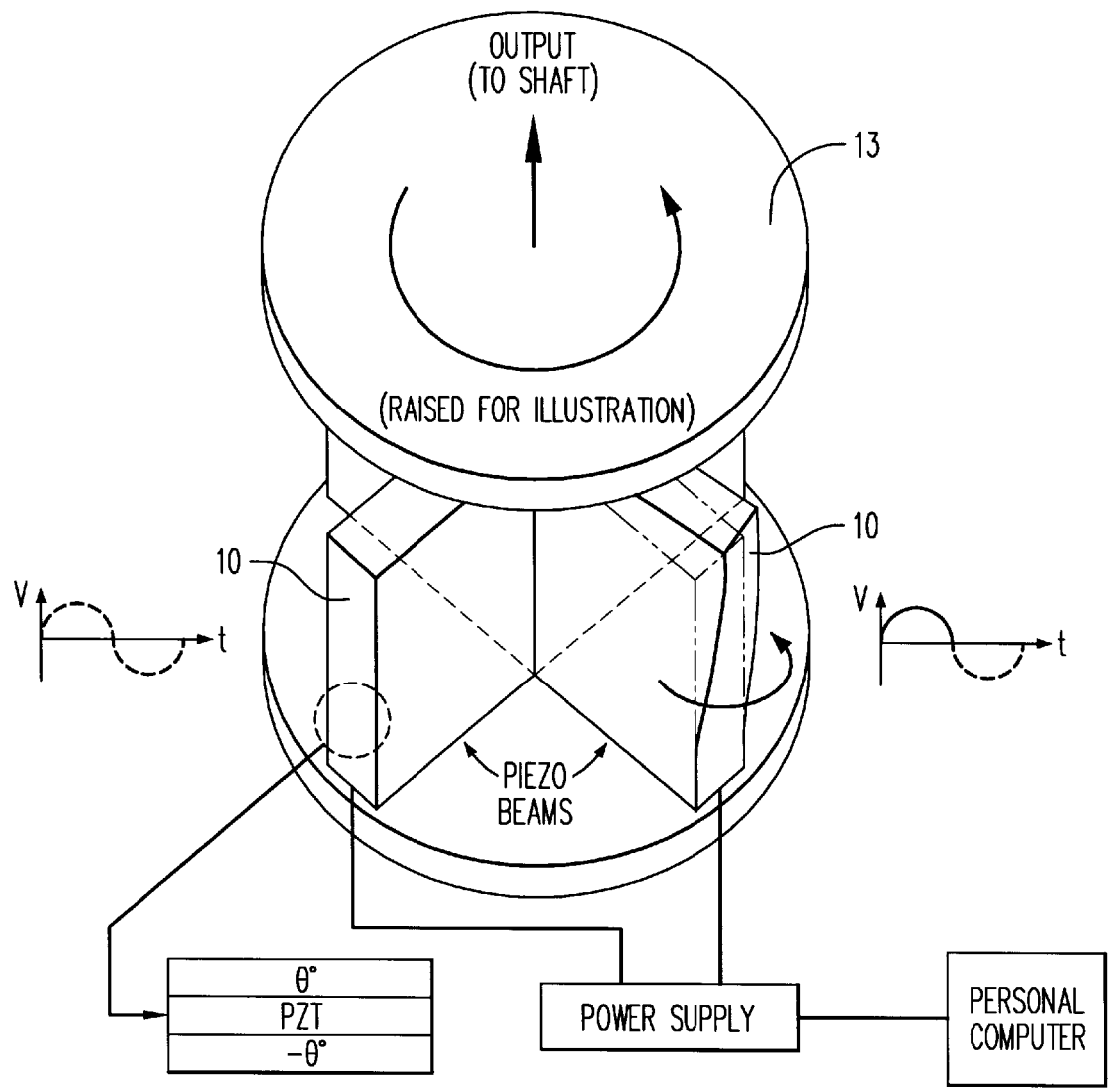
FIG. 4 illustrates an alternative embodiment of the invention.

FIG. 4 shows an alternate embodiment having two driving elements in the form of beams 10. Each beam 10 generally corresponds in its structure to the beam 1 of the first embodiment. The two beams 10 are disposed at right angles to each other and in an unexcited state each beam 10 is in loose contact with a rotor disc 13. Upon application of a voltage to the central piezoelectric element of each respective beam that beam twists into firm contact with the rotor disc 13 and imparts a rotary driving motion to the disc. The two beams 10 are given an applied voltage successively so that they each give a rotary driving action in turn to the rotor disc. Naturally more than two beams could also be used.

We claim:

1. A motor comprising a plate-like laminate driving member comprising an inner layer of piezoelectric material and outer layers formed of an anisotropic material that are disposed at symmetrically opposite angles of orientation relative to said inner layer, said driving member being fixed at a first end, a rotor disc positioned closely adjacent a second end of said driving member such that said driving member is generally perpendicular to said disc, and means for applying an electric voltage to said piezoelectric material, wherein when no voltage is applied to said piezoelectric material said driving member is in loose contact with said disc, and wherein upon application of a voltage to said piezoelectric material said driving member expands into firm contact with said disc with a torsional movement and imparts a rotary motion to said disc.

2. A motor as claimed in claim 1 wherein said piezoelectric material is a piezoelectric ceramic material.

3. A motor as claimed in claim 1 wherein said anisotropic material is a fiber-reinforced plastics material.

4. A motor as claimed in claim 1 wherein said driving member has a width at least equal to the diameter of said rotor disc.

5. A motor as claimed in claim 1 further comprising means for controlling the voltage to be applied to said piezoelectric material.

6. A motor as claimed in claim 1 wherein said voltage is applied at a high frequency.

7. A motor as claimed in claim 6 wherein said frequency is at least 1000 Hz.

8. A motor as claimed in claim 1 comprising a plurality of driving members.

9. A motor as claimed in claim 8 comprising two mutually orthogonal driving members.

10. A motor as claimed in claim 9 wherein voltage is applied to said driving members out of phase.

* * * * *